United States Patent [19]

Conru et al.

[11] Patent Number: 5,545,921

[45] Date of Patent: Aug. 13, 1996

[54] PERSONALIZED AREA LEADFRAME COINING OR HALF ETCHING FOR REDUCED MECHANICAL STRESS AT DEVICE EDGE

[75] Inventors: Harold W. Conru; Francis E. Froebel, both of Essex Junction; Albert J. Gregoritsch, Jr., South Burlington; Sheldon C. Rieley, Burlington; Stephen G. Starr, Essex Junction; Ronald R. Uttecht, Essex Junction; Eric J. White, Essex Junction, all of Vt.; Jens G. Pohl, Bernmardswald-Erlbach, Germany

[73] Assignees: International Business Machines, Corporation, Armonk, N.Y.; Siemens Aktiengesellschaft, Munich, Germany

[21] Appl. No.: 334,478

[22] Filed: Nov. 4, 1994

[51] Int. Cl.⁶ .......................... H01L 23/495; H01L 23/48
[52] U.S. Cl. .......................... 257/669; 257/674; 257/692; 361/807; 361/813
[58] Field of Search ........................ 257/669, 674, 257/692; 361/807, 813

[56] References Cited

U.S. PATENT DOCUMENTS

| | | | |
|---|---|---|---|
| 4,209,355 | 6/1980 | Burns | 156/630 |
| 4,210,926 | 7/1980 | Hacke | 357/70 |
| 4,722,060 | 1/1988 | Qunin et al. | 364/490 |
| 4,754,912 | 7/1988 | Burns | 228/164 |
| 4,797,726 | 1/1989 | Manabe | 357/70 |
| 4,803,540 | 2/1989 | Moyer et al. | 357/70 |
| 4,862,245 | 8/1989 | Pashby et al. | 357/70 |
| 4,924,292 | 5/1990 | Kaufman | 357/70 |
| 5,068,712 | 11/1991 | Murakami et al. | 357/72 |

FOREIGN PATENT DOCUMENTS

| | | | |
|---|---|---|---|
| 0086155 | 3/1990 | Japan | 257/674 |
| 0109928 | 4/1993 | Japan | 257/669 |

Primary Examiner—Mahshid Saadat
Assistant Examiner—David Ostrowski
Attorney, Agent, or Firm—Whitham, Curtis, Whitham & McGinn; Eugene I. Shkurko; Adel Amed

[57] ABSTRACT

A lead on chip (LOC) semiconductor leadframe package provides notched lead-fingers to eliminate mechanical shear-stress at the peripheral edge of a semiconductor chip. Opposite rows of substantially flat cantilevered lead-fingers are attached by double-sided adhesive tape in thermal contact with the active face of a chip. The lead-fingers are routed in personalized paths over the face of the chip to cover a large surface area to aid heat dissipation. All wirebond connections between the lead-fingers and the chip are made at a centerline connection strip running down the center of the chip. Each of the cantilevered lead-fingers has a notched portion positioned directly over the vulnerable peripheral chip edge to reduce thermal, mechanical shear-stress. Additionally, since corrosion typically follows a lead path, the notch provides an increasing path length to prevent corrosive ingress over the chip face.

7 Claims, 4 Drawing Sheets

PERSONALIZED AREA LEADFRAME COINING OR HALF ETCHING FOR REDUCED MECHANICAL STRESS AT DEVICE EDGE

BACKGROUND OF THE INVENTION

1. Field of the Invention

The present invention generally relates to lead-on-chip (LOC) packaging, also known as A-wire packaging, for semiconductor devices and, more particularly, to a planar leadframe having a notched lead-finger configuration for reducing mechanical stress at the chip edge.

2. Description of the Prior Art

The size and nature of modern semiconductor chips are such that it is physically impractical to incorporate both an integrated circuit and its leads in single chip structure. Hence, modern chips are manufactured without leads and are later fitted into a leadframe package structure which supplies outside leads to the chip. Early semiconductor leadframes used lead contacts which bonded directly to the input/output ports on the active face of the chip. U.S. Pat. Nos. 4,210,926 to Hacke and 4,209,355 to Burns are both examples of such directly bonded semiconductor leadframes. As illustrated in FIGS. 1A–B, a chip 12 is positioned in the leadframe 10 and surrounded by a plurality lead-fingers 14. Raised contacts 16 at the tips of lead-fingers 14 are solder bonded directly to bonding pads around the peripheral edges of the chip 12. Chips packaged in this manner are sometimes referred to as spiders since the lead-fingers resemble spider legs emanating from around a chip body. The contacts 16 are formed by partially etching the lead-fingers 14 near the tip to leave a bump of conductive material. The lead-fingers are bonded directly to the chip by applying pressure and forcing the lead-fingers into the active chip face as shown by arrow 18. The raised contacts 16 ensures that the whole finger is not smashed into the chip face when bonding pressure is applied. U.S. Pat. No. 4,924,292 to Kaufman shows a similar direct bonding technique except that instead of an etched bump, the finger is crimped near the tip to arch the length portion of the finger away from the chip surface.

As semiconductor chips become more and more densely integrated, the electrical leads required to connect the chip to the outside world become so numerous in comparison to chip size that directly connected leads are not practical. Additionally, modern semiconductor leadframe packages must also be designed to dissipate heat that large scale integrated chips generate during the course of normal operation. Several leadframe packaging technologies have been developed to address these problems. For example, FIG. 2 shows a leadframe package having lead-fingers 30 which are spaced around the periphery of the chip 32. However, rather than the finger contacting the chip directly, each finger is wirebonded to the chip. This makes it possible to connect many more leads to the chip than was previously possible with direct bonding. Wirebonds 34 electrically connect lead contacts 38 to chip contacts 36 on the periphery of the chip 32. Unfortunately, the wirebonds inherently possess high impedance which, when compounded by their length, present undesirable electrical characteristics and signal delays. Furthermore, almost no heat dissipation is provided for the chip and the peripherally distributed contacts provide multiple entry points for contamination.

U.S. Pat. No. 4,864,245 to Pashby et al. shows a Lead-On-Chip (LOC) semiconductor package, designed to eliminate the aforementioned problems. As shown in FIG. 3, all electrical chip connections route through vias 40 extending in lines down the center of the active chip face 42. Flat lead-fingers 44 are secured on either side of the chip with an insulating adhesive strip 45. Rows of lead-fingers run parallel to each other and arch directly over the active face of the chip terminating just short of the center at the adhesive strip 45. Since all connections are made at the center of the chip, shorter wirebonds 46 which are substantially uniform in length may be used. LOC packages of this type having center line connections greatly reduce the signal delays and timing variances associated with the periphery connections of the prior art and generally improve the electrical characteristics of the package. Furthermore, the lead-fingers aid heat dissipation to some degree since they tend to carry heat away from the chip at the adhesive strip 45.

To minimize thermal shear-stress at the chip/lead-finger interface, leadframes are normally made of a material which has a low coefficient of thermal expansion close to that of silicon, such as, for example, copper or nickel-iron alloys. However, even if the coefficients are closely matched, high stresses are still experienced in LOC packages. The larger the surface area coverage between the lead-finger and the chip face, the greater the stress becomes. Even small variations in thermal expansions tend to aggregate at the chip edge and cause cracking or other damage to the active chip face leading premature chip failure or spurious chip operation.

To minimize the thermal shear-stress problem, one technique has been to raise or arch the otherwise straight fingers over the edge of the chip such that the fingers do not contact the chip edge. As illustrated in FIG. 3 the fingers 44 arch away from the chip 42 after the adhesive strip 45. This technique is known in the art as "downsetting" and is shown in, for example, U.S. Pat. No. 5,068,712 to Murakami et al. While downsetting reduces thermal shear-stress, it suffers the drawback of making the leadframe non-planar, fragile and unstackable. This is a significant problem, particularly during the manufacturing process. For example, non-planar leadframes are not well suited for following a manufacturing track or automated assembly line. Additionally, non-planar, down set leadframes are not stackable since leadframes near the bottom may collapse under the weight of the leadframes on top. Furthermore, downset leadframes only offer minimal heat dissipation since the lead-fingers only contact a small surface of the chip face.

SUMMARY OF THE INVENTION

It is therefore an object of the present invention to provide a robust lead-on-chip (LOC) leadframe having notched lead-fingers to reduce mechanical shear-stress at the chip edge.

It is yet another object of the present invention to provide an LOC leadframe which has centerline wirebond connections and lead-fingers connected with adhesive to the chip face to aid heat dissipation.

It is yet another object of the present invention to provide a planar leadframe having flat lead-fingers to facilitate the manufacturing process.

According to the invention, a planar leadframe package for a semiconductor chip has opposite rows of flat lead-fingers which ingress over a large surface area of the active face of the chip and cantilever off the peripheral edge of the chip at one end. The lead fingers are attached in mechanical and thermal contact with active face of the chip by double-sided adhesive tape. Electrical connections between the lead-fingers and the chip are made by wirebond connections at a center connection strip running down the center of the chip. Heat generated by the chip is effectively conducted away from the chip and dissipated from the leadframe package by the lead-fingers. Each of the lead-fingers has a notched portion positioned directly over the chip edge. The notch prevents differences in thermal expansion rates between the chip, adhesive tape, and lead-finger from stressing the vulnerable chip edge. Additionally, since corrosion typically follows a lead path, the notch provides an increasing path length to prevent corrosive ingress over the chip face.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
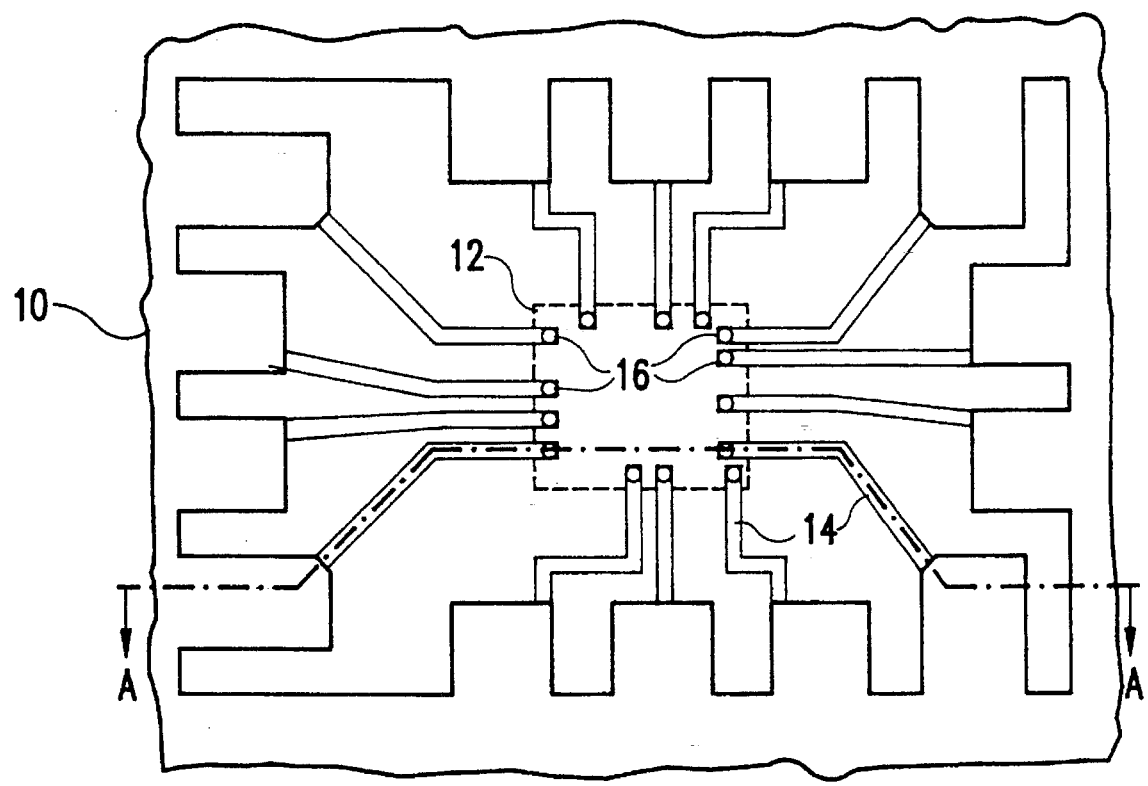
FIG. 1A is a drawing of a prior art direct contact leadframe.
Figure 1B:
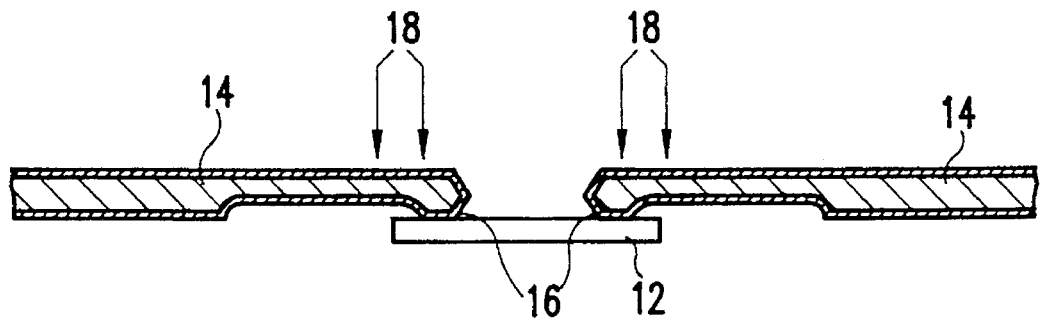
FIG. 1B is a drawing of the prior art leadframe shown in FIG. 1A taken along line A—A'.
Figure 2:
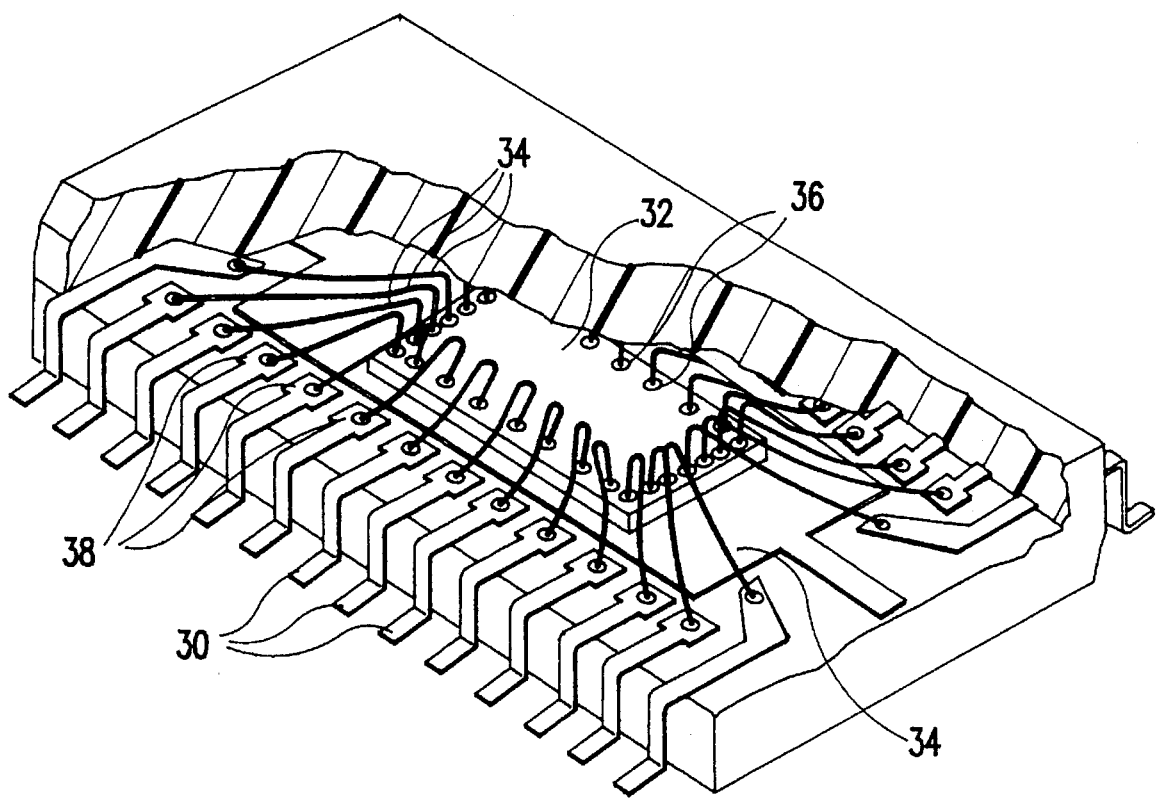
FIG. 2 is a drawing showing a broken view of a prior art lead frame having peripheral connections.
Figure 3:
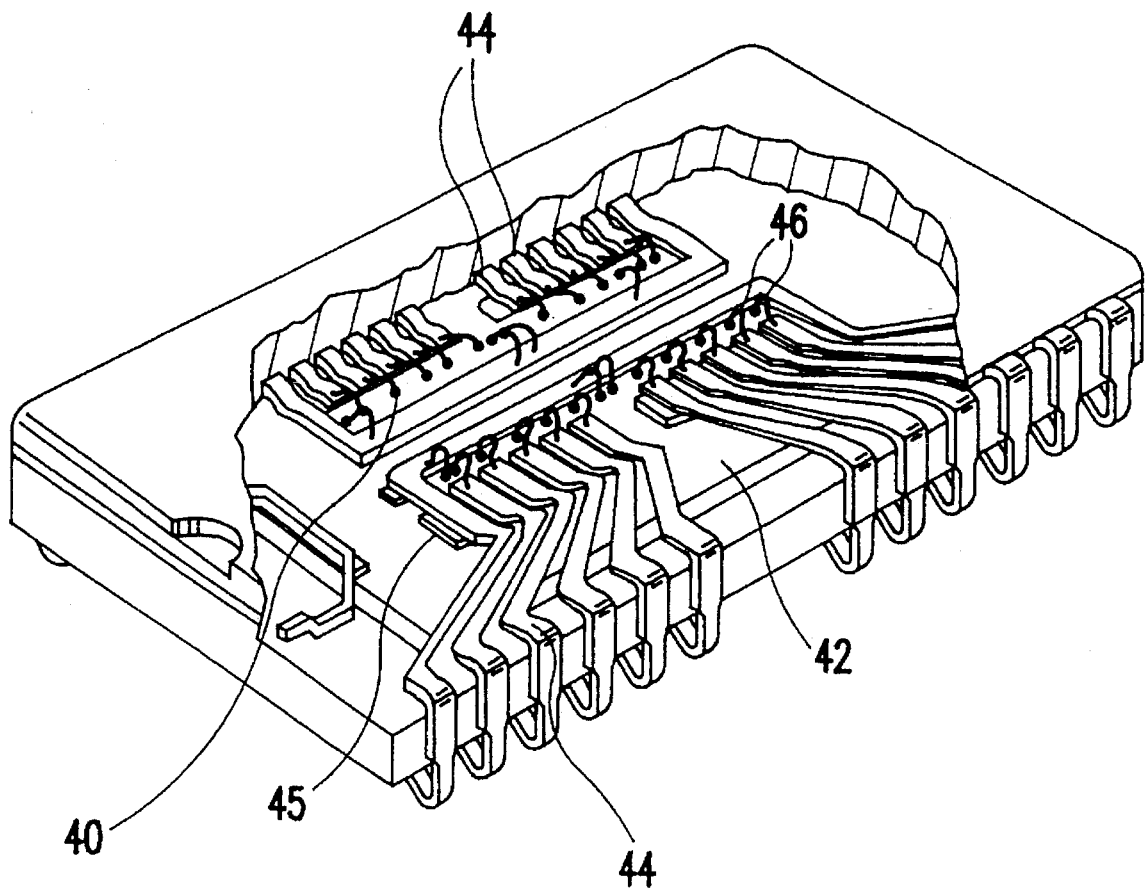
FIG. 3 is a drawing showing a broken view of a prior art semiconductor package using a downset lead-on-chip (LOC) leadframe.
Figure 4:
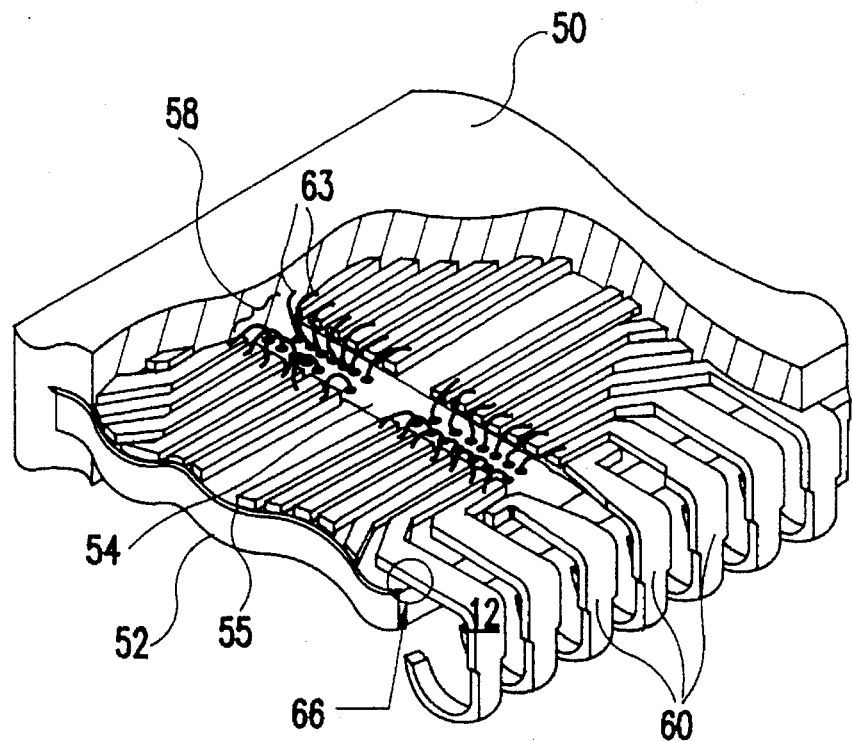
FIG. 4 is a drawing showing a broken view of the LOC semiconductor package having a notched lead-finger according to the present invention.

Referring now to the drawings, and more particularly to FIG. 4, there is shown a lead-on-chip (LOC) leadframe package according to the present invention. The semiconductor package includes an outer casing 50 which houses a semiconductor chip 52. The chip 52 includes an active face 54 covered by a double sided adhesive layer or tape 55. A center connection strip 58 extends down the center of the active chip face. A portion of the adhesive layer 55 is removed to provide access to chip contact pads (not shown). Wirebonds 63 electrically connect a plurality of lead-fingers 60 to chip contact pads (not shown). The lead-fingers 60 are cantilevered over a peripheral edge of the chip 52 and are routed over the double sided adhesive layer 55 in paths personalized to cover a predetermined portion of the surface area for a particular chip 52. In the preferred embodiment the center connection strip 58 runs down an axis of the chip 52 and the lead-fingers 60 are cantilevered in parallel rows from opposite sides of the chip 52 parallel to the center connection strip 58. The lead-fingers 60 are routed in parallel paths with 90° bends 64 over the double sided adhesive layer 55 and terminate perpendicular to the center connection strip 58. The double sided adhesive layer 55 securely adheres the lead-fingers 60 in mechanical and thermal contact over a large portion of the of the active face of the chip 54. During manufacturing, the double sided adhesive layer 55 may either be applied to the lead-fingers 60 and then to the chip face 54 or vice-versa. The lead-fingers 60 have a wide portion 62 which extends out of the package 50 and tapers to a thinner width over the chip 52. The personalized routing of the lead-fingers 60 ensures that a large surface area of the active chip face 54 is in mechanical and thermal contact with the lead-fingers 60. This reduces the risk of corrosion causing contaminates contacting the chip face is reduced. Additionally, the comprehensive surface area coverage of the lead-fingers 60 over the active face provide an effective vehicle for dissipating substantial quantities of heat which are generated by the chip 52.

Those skilled in the art will recognize that even very small differences in coefficients of thermal expansion between the lead-fingers 60 and the chip 52 will be compounded due to the large surface area coverage and concentrated at the chip edge causing unacceptable shear-stress levels. To alleviate stress at the chip edge, the lead-fingers are coined or half-etched to create a notch 66 over the chip edge. The notch eliminates shear-stress caused by the lead frame at the chip edge and thereby increases chip life and reliability. In the preferred embodiment, the notch is shown as being square; however, the notch may be of any shape, such as, for example, rectangular, semi-circular, triangular, or a random shape. Additionally, since corrosion typically follows a lead path, the notch provides an increased path length to prevent corrosive ingress over the chip face.

Figure 5:
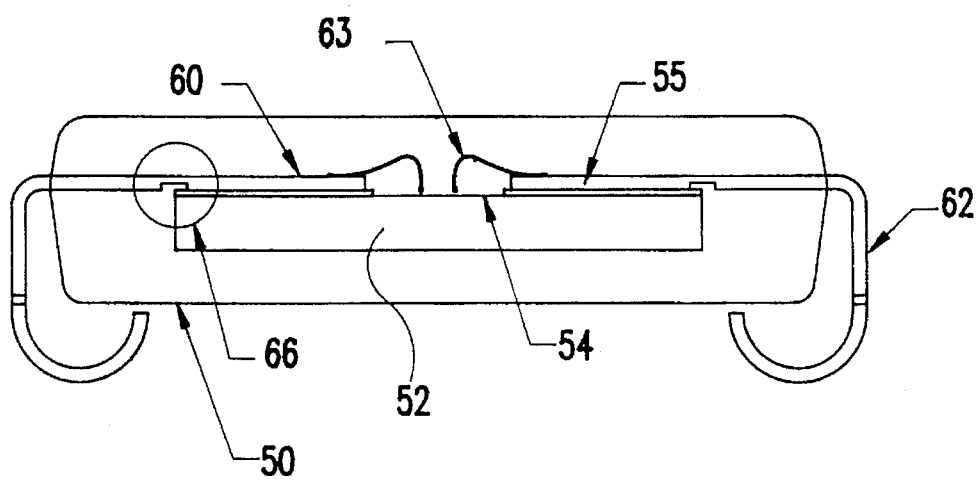
FIG. 5 is a drawing showing a cross sectional view a semiconductor package having a notched lead-finger according to the present invention.

FIG. 5 shows a cross sectional view of a semiconductor package having a notched lead-finger similar to the package shown in FIG. 4 except that the lead-fingers 60 are shown as being straight and extending across the active chip face 54, over adhesive layer 55. The notched portion of the lead-finger 66 is shown positioned over the chip edge 52 to alleviate mechanical shear-stress at the edge and corrosive ingress.

While the invention has been described in terms of a single preferred embodiment, those skilled in the art will recognize that the invention can be practiced with modification within the spirit and scope of the appended claims.

We claim:

1. A lead on chip (LOC) semiconductor package, comprising:

a semiconductor chip having an active face terminating at a peripheral edge;

an adhesive layer covering at least a portion of said active face of said semiconductor chip;

a plurality of lead-fingers having a first portion extending in a planar fashion over said active face of said semiconductor chip in contact with said adhesive layer, and a second portion extending beyond said peripheral edge, each of said plurality of lead-fingers having a notch located directly over said peripheral edge; and an encapsulant for encasing said semiconductor chip, said plurality of lead-fingers projecting out from said encapsulant.

2. A lead on chip (LOC) semiconductor package as recited in claim 1, further comprising:

a center connection strip extending over said active face, said first portion of said lead-fingers terminating prior to said center connection strip; and wirebonds electrically connecting said plurality of lead-fingers to said chip at said center connection strip.

3. A lead on chip (LOC) semiconductor package as recited in claim 1 wherein said adhesive layer is double sided adhesive tape.

4. A lead on chip (LOC) semiconductor package as recited in claim 1 wherein said first portion of each of said plurality of lead-fingers are routed over said adhesive layer in parallel paths covering a predetermined portion of said active face.

5. A lead on chip (LOC) semiconductor package as recited in claim 4 wherein said first portion of each of said plurality of lead-fingers are routed over said adhesive layer having bends totaling 90°.

6. A lead on chip (LOC) semiconductor package as recited in claim 1 wherein said first portion of each of said plurality of lead-fingers has a width less than that of said second portion.

7. A lead on chip (LOC) semiconductor leadframe package, comprising:

an adhesive layer for covering at least a portion of an active face of a semiconductor chip;

a plurality of lead-fingers extending in a planar fashion over said adhesive layer, at least one of said plurality of lead-fingers having a notch positioned to fit over a peripheral edge of a semiconductor chip.

* * * * *